United States Patent [19]

Beasom

[11] Patent Number: 5,602,052
[45] Date of Patent: Feb. 11, 1997

[54] METHOD OF FORMING DUMMY ISLAND CAPACITOR

[75] Inventor: James D. Beasom, Melbourne Village, Fla.

[73] Assignee: Harris Corporation, Melbourne, Fla.

[21] Appl. No.: 427,231

[22] Filed: Apr. 24, 1995

[51] Int. Cl.⁶ .............................. H01L 21/70; H01L 27/00
[52] U.S. Cl. .................................................. 437/60; 437/919
[58] Field of Search .............................. 437/47, 52, 60, 437/919, 228

[56] References Cited

U.S. PATENT DOCUMENTS

| | | | |
|---|---|---|---|
| 3,460,010 | 8/1969 | Domenico et al. | 257/296 |
| 4,214,252 | 7/1980 | Goerth | 257/296 |
| 5,086,370 | 2/1992 | Yasaitis | 361/313 |
| 5,102,819 | 4/1992 | Matsushita et al. | 437/52 |
| 5,151,768 | 9/1992 | Aso | 257/524 |
| 5,173,835 | 12/1992 | Cornett et al. | 257/310 |
| 5,264,723 | 11/1993 | Strauss | 257/532 |
| 5,296,734 | 3/1994 | Satoh | 257/638 |

*Primary Examiner*—H. Jey Tsai
*Attorney, Agent, or Firm*—Rogers & Killeen

[57] ABSTRACT

A method of forming a capacitor in a bonded wafer using the same process steps used to form integrated circuit devices in the bonded wafer. The bonded wafer may comprise a device wafer and a handle wafer, each of which forms a capacitor plate, bonded together with a dielectric therebetween. The device wafer may be divided into one or more insulated islands for the formation of integrated circuit devices, and a dummy island external of the insulated islands. One or more capacitor plates may be formed from the dummy island in the device wafer. The device wafer may include buried layers and an isolation trench along an outer edge separating the semiconductor material of the die from the wafer. The wafer may also be formed by the ZMR and SIMOX processes. In addition, other circuit structures such as thin film resistors may be formed on or above the upper insulator.

43 Claims, 2 Drawing Sheets

METHOD OF FORMING DUMMY ISLAND CAPACITOR

BACKGROUND OF THE INVENTION

The present invention relates to methods for forming a capacitor in an integrated circuit ("IC").

Large value or high voltage capacitors are sometimes required in integrated circuits. The creation of a high voltage capacitor necessitates the devotion of a proportionately large circuit area to the capacitor. Required capacitor area may be especially large if high voltage MOS type capacitors are used because the thickness of the capacitor dielectric must be increased to support the high voltage. Since capacitance is inversely proportional to dielectric thickness, increases in the dielectric thickness result in an increase of the dielectric area required to achieve a given capacitance. Examples of such high voltage capacitors include compensation capacitors for operational amplifiers and filter capacitors in low pass filters.

As an illustration, a typical capacitor required in an integrated circuit might be a 100 pf, 200 V capacitor having a dielectric of silicon dioxide. If the dielectric thickness is set at 0.6667 microns to limit the electric field across the dielectric to 3,000,000 V/cm, then the required capacitor area is 0.0194 square centimeters, a relatively large area in an integrated circuit environment. The area required for such a capacitor results in an enlargement of the overall IC containing both the capacitor and the IC device.

In order to conserve space in integrated circuits, capacitors may be formed from the material which is not devoted to the formation of IC devices. Additionally, the cost of manufacturing IC's which include capacitors may be reduced by the use of the same process steps required to make the IC devices in the making of the capacitors.

Accordingly, it is an object of the present invention to provide a novel method of forming a capacitor from material in an integrated circuit which is not used for IC devices.

It is a further object of the present invention to provide a novel method of forming a capacitor in an integrated circuit using some of the same process steps that are used to form devices in the integrated circuit.

It is still a further object of the present invention to provide a novel method of forming a capacitor in an integrated circuit which reduces the risk of shorting between capacitor plates.

It is sometimes desirable to add other circuit structures to the circuit and such structures generally add significantly to the area required for the circuit. It accordingly an object of the present invention to provide a novel method of forming resistive circuit elements on the same area with capacitors.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1A:
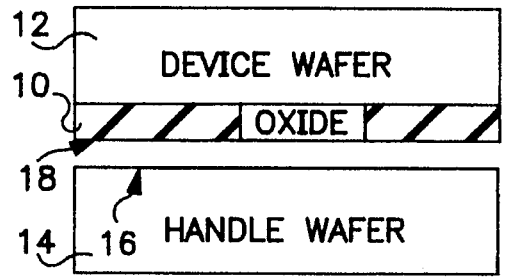
FIG. 1A is an elevation in cross-section which shows a portion of a device wafer and a handle wafer prior to being bonded together.

The steps of a preferred method of forming a capacitor in a bonded wafer are illustrated by FIGS. 1A through 1F. With reference to FIG. 1A, a device wafer 12 is provided with an oxide layer 10 insulator surface on the bottom surface thereof. Preferably the oxide layer 10 is one to three microns thick, but may be in the range of 0.1 to five microns thick. The device wafer 12 is made of semiconductor material and is initially at least about 500 microns thick to enable the device wafer to be handled without substantial risk of breakage.

Figure 1B:
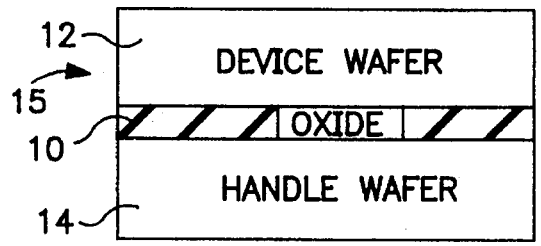
FIG. 1B is an elevation in cross-section which shows the device wafer and handle wafer of FIG. 1A after being bonded together to form a bonded wafer.

Next, a handle wafer 14 of semiconductor material which may be at least about 500 microns thick to avoid breakage, may be brought into contact with the oxide layer 10 and bonded thereto using known methods to form the bonded wafer 15 shown in FIG. 1B. The bond is made along the top surface 16 of the handle wafer 14 and the exposed bottom surface 18 of the oxide layer 10.

In alternative embodiments, the oxide layer 10 may be formed by thermal growth, by oxide deposition or by any other suitable conventional oxide formation method. Furthermore the oxide layer 10 may be formed on the top of the handle wafer 14 instead of on the bottom of the device wafer 12. The composite wafer 15 may also be formed by forming the device wafer 12 on the oxide layer by a zone melt recrystallization or a separation by oxygen implant process. Thinning is generally not required where the wafer is formed by these methods. Regardless of the sequence or particular method of forming the oxide layer 10, the device wafer 12 and the handle wafer 14, the final wafer structure will be that of FIG. 1B, with the oxide layer 10 sandwiched between the device wafer 12 and the handle wafer 14.

Figure 1C:
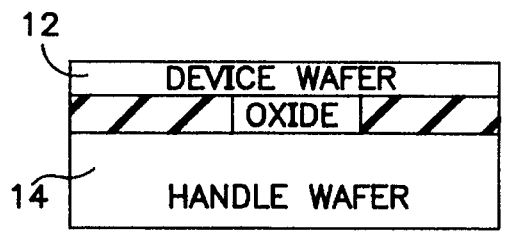
FIG. 1C is an elevation in cross-section which shows the bonded wafer of FIG. 1B after the device wafer has been thinned.

With reference to FIG. 1C, the device wafer 12 may be thinned from its initial approximate 500+ micron thickness to a thickness in the range of 1 to 30 microns by the selective removal of an upper portion of the device wafer in preparation for the formation of devices and one or more capacitor plates within it. The handle wafer 14 lends support to the thinned device wafer 12 thereby greatly reducing the risk of breaking the device wafer during subsequent handling.

Figure 1D:
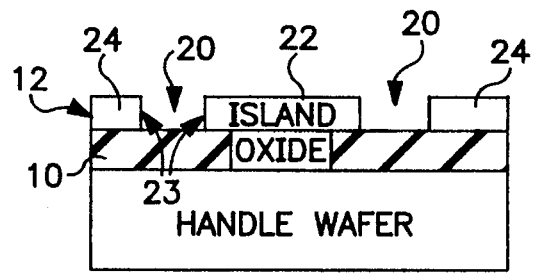
FIG. 1D is an elevation in cross-section which shows the bonded wafer of FIG. 1C after channels have been formed in the device wafer to create a device island.

Next, with reference to FIG. 1D, channels 20 may be etched into the device wafer 12 to form one or more device islands 22 of semiconductor material and at least one continuous dummy island 24 of semiconductor material. The channels 20 may extend completely through the thinned device wafer 12 to the oxide layer 10, as shown in FIG. 1D, thereby completely defining the edges of the device island 22 and the dummy island 24. Preferably the walls 23 of the channels 20 are substantially perpendicular to the oxide layer 10, and are between 1 and 30 microns high and are at least two microns wide. The walls alternatively may make an acute or obtuse angel with the oxide layer 10 to selectively modify the area of the dummy island 24 along its juncture with the oxide layer 10.

Figure 2:
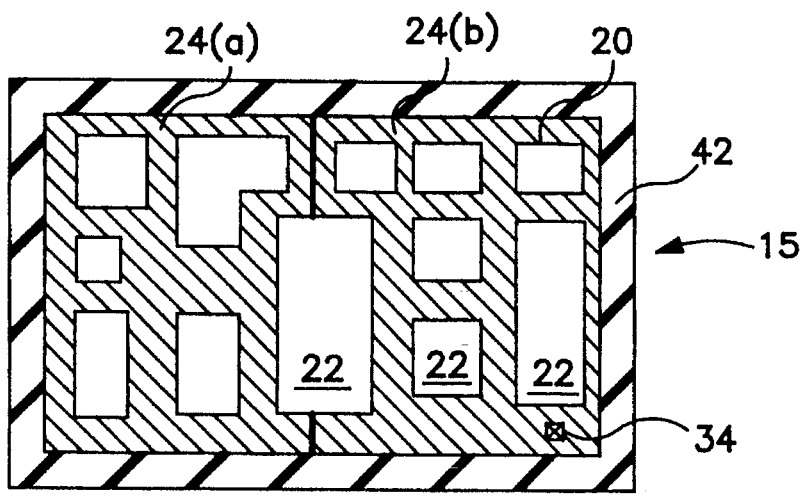
FIG. 2 is a section taken through lines A—A of FIG. 1F which shows the device islands and two dummy islands of the bonded wafer bounded by an isolation trench not shown in FIG. 1F.

Any one of a number of different known integrated circuit devices may be formed in the device islands 22. It is also appreciated that the pattern of the channels 20 may be tailored to form two or more dummy islands, e.g. dummy islands 24(a) and 24(b) as shown in FIG. 2. The device islands 22 may be of different shapes and sizes suitable for the formation of the different types of IC devices.

In the preferred method, the formation of the channels 20 may include the formation of an isolation trench 42, shown in FIG. 2, adjacent the outer edge of the bonded wafer 15. The isolation trench may be filled with an insulating material to protect the edge of the bonded wafer during separation of the wafer into a die thereby reducing the risk of damaging the capacitor plates or dielectric insulation in the bonded wafer and reducing the risk of shorting the two capacitor plates.

Surrounding the device islands 22, and also defined by the channels 20, are the two dummy islands 24(a) and 24(b) of the bonded wafer of FIG. 2 which serve as the upper plates of the capacitors to be formed in the bonded wafer. Since the dummy islands are comprised of the portion of the device wafer external of the device islands, the dummy islands may assume any number of shapes depending upon the number, size and shape of the device islands in the bonded wafer and/or depending on the channels which may separate the external portion into portions of the desired size and shape.

Figure 1E:
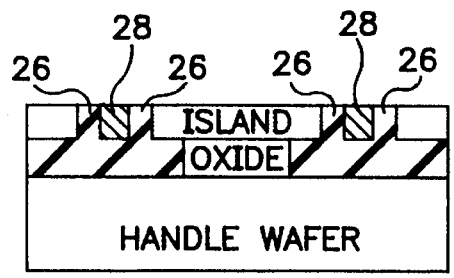
FIG. 1E is an elevation in cross-section which shows the bonded wafer of FIG. 1D after the channel walls have been coated with an insulation material and spaces between the channel walls have been filled with polycrystalline silicon.

With reference to FIG. 1E, insulation coatings 26 of oxide may be provided by any suitable conventional process on the walls of the channels 20 and any space that remains between the insulation coatings 26 in a particular channel may be filled with polycrystalline silicon 28 to further insulate the device islands from the dummy island. As an alternative to forming the insulation channels by removing material and filling the resultant void with an insulative material, conventional conversion techniques may by used to convert portions of the device wafer material into an insulation channel.

Figure 1F:
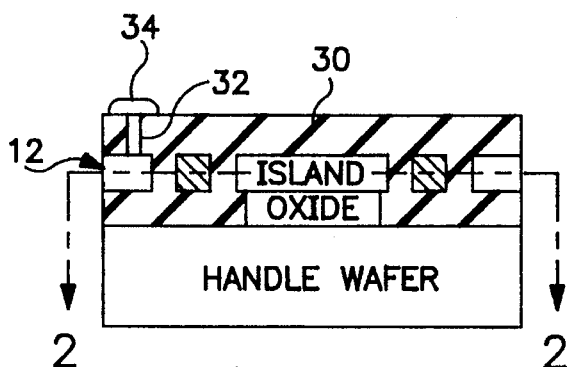
FIG. 1F is an elevation in cross-section which shows the bonded wafer of FIG. 1E after an upper insulation layer and an electrical contact have been applied to the device wafer.

Finally, as shown in FIG. 1F, an upper oxide layer 30 may be deposited over the upper surface of the device wafer 12 in a thickness suitable for insulating the device islands 22 and the dummy island 24 from undesired electrical contact with external devices. One or more holes 32 may be provided in the upper oxide layer 30, e.g. by masking during the deposition of the upper oxide layer, to allow contact between a device island or a dummy island with an external electrical device, e.g. via a conventional contact 34.

Figure 3:
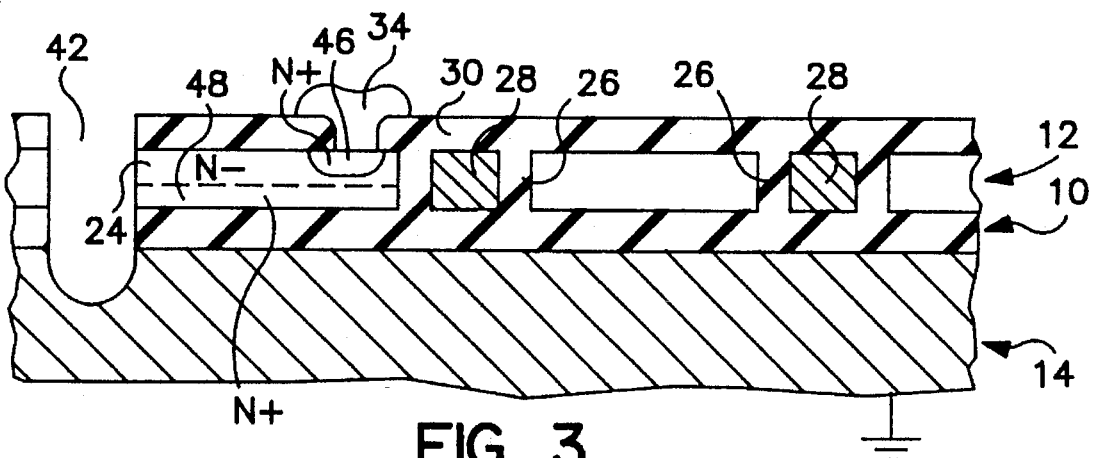
FIG. 3 is an elevation in cross-section of a bonded wafer having a dummy island with a buried layer and a high concentration diffused region below an electrical contact.

With reference to FIG. 3, a buried layer 48 (e.g. an N+ regions for an N type island) may be formed in one or more of the dummy islands 24 by any conventional means prior to the bonding of the handle wafer to the device wafer.

With continued reference to FIG. 3, the contact 34 facilitates the connection of the dummy island 24 as the upper plate of the capacitor to be formed. It is assumed that the handle wafer is grounded or contacted in a conventional manner to form the lower plate of the capacitor. Thus the dummy island 24 serves as the upper capacitor plate, the handle wafer 14 as the bottom plate and the oxide layer 10 as the intervening dielectric. A high concentration diffused region 46 (e.g. an N+ region for an N type island) may be formed in a conventional manner in the dummy island under the contact 34 to facilitate electrical connection between the dummy island 24 and the contact 34.

The foregoing method of forming a capacitor is advantageous because it may utilize the same processing steps as are used to form other IC devices, such as transistors and diodes, in a bonded wafer. Because the same process steps are used to form the capacitor and the IC devices, the die from which the bonded wafer is formed need not be removed from the IC processing environment to form the capacitor. Accordingly the method provides an efficient and cost effective way of forming a capacitor in the portions external of an IC in a bonded wafer.

Figure 4:
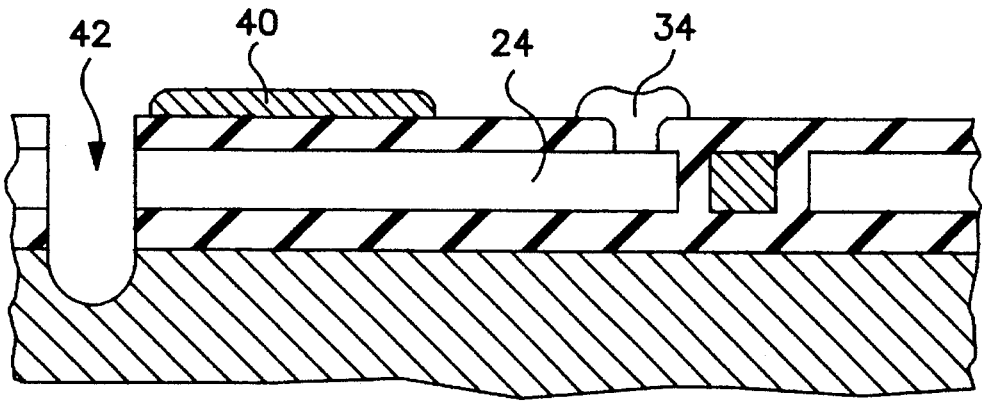
FIG. 4 is an elevation in cross-section of a portion of the wafer of FIG. 3 with thin film resistors added thereon.

In addition, it is highly desirable in some applications to form resistors in the IC without increasing the area required. With reference to FIG. 4 for example, other circuit structures such as the illustrated thin film resistor 40 may be formed by suitable conventional techniques on or above the surface of the top insulator 30 shown in FIG. 3. In this way the area of the IC over the capacitor plate 24 may be utilized for resistive components.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers, at least one of the wafers being homogeneous;

b) providing an insulator layer at a surface of one of the wafers;

c) bonding the wafers together with the insulator layer therebetween to form a bonded wafer;

d) thinning the homogeneous wafer;

e) isolating a portion of the thinned homogeneous wafer to form a device island therein whereby a portion of the thinned homogenous wafer external of the device island forms an upper capacitor plate, the other wafer forms a lower capacitor plate, and the insulator layer forms a capacitor dielectric between the two capacitor plates.

2. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers;

b) providing an insulator layer at a surface of one of the wafers;

c) bonding the wafers together with the insulator layer therebetween to form a bonded wafer;

d) thinning one of the wafers;

e) isolating a portion of the thinned wafer to form a device island therein whereby a portion of the thinned wafer external of the device island forms an upper capacitor plate, the unthinned wafer forms a lower capacitor plate, and the insulator layer forms a capacitor dielectric between the two capacitor plates, said device island being formed by the steps of:

(i) etching a channel into the thinned wafer from an exposed surface to the insulator layer; and (ii) forming a layer of insulation on the interface between the channel and the thinned wafer.

3. The method of claim 2 further comprising the step of:

f) providing an upper insulator layer on the exposed upper surface of the thinned wafer with at least one aperture therein communicating with the upper capacitor plate.

4. The method of claim 3 including the step of:

g) doping a region of the device wafer through the aperture.

5. The method of claim 3 further comprising the steps of:

g) providing an electrical contact extending through the aperture to the upper capacitor plate; and h) providing an electrical contact to the lower capacitor plate.

6. The method of claim 1 wherein the step of forming a device island comprises the steps of:

(i) etching a channel into the thinned wafer from an exposed surface to the insulator layer; and (ii) filling the channel with an insulating material.

7. The method of claim 6 wherein the channel is filled by providing an electrically insulative layer on the walls of the channel and depositing polycrystalline silicon in the space between the insulated walls of the channel.

8. The method of claim 7 wherein the electrically insulative layer is formed on the channel walls by oxide deposition.

9. The method of claim 7 wherein the electrically insulative layer is formed on the channel walls by thermally growing oxide.

10. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers;

b) providing an insulator layer at a surface of one of the wafers;

c) bonding the wafers together with the insulator layer therebetween to form a bonded wafer;

d) thinning one of the wafers;

e) isolating a portion of the thinned wafer to form s device island therein whereby a portion of the thinned wafer external of the device island forms an upper capacitor plate, the unthinned wafer forms a lower capacitor plate, and the insulator layer forms a capacitor dielectric between the two capacitor plates, f) forming an isolation trench adjacent an outer edge of a die; and g) lining the isolation trench with an insulating material so that the outer edge of the die is protected from damage during the removal of the die containing the capacitor from a wafer thereby reducing the risk of shorting between the capacitor plates.

11. The method of claim 10 wherein the step of forming the isolation trench comprises etching the isolation trench into the bonded wafer.

12. The method of claim 2 further comprising the step of forming a buried layer in a portion of the thinned wafer.

13. The method of claim 12 wherein the buried layer is formed in a portion of the thinned wafer external to the device island to be formed.

14. The method of claim 12 wherein the buried layer is formed in the wafer that is to be thinned prior to the wafer being bonded to another wafer.

15. The method of claim 2 further comprising the step of:

f) isolating the thinned wafer external of the device island into two or more regions.

16. The method of claim 2 wherein said device island and said upper capacitor plate have substantially the same thickness.

17. The method of claim 2 wherein the step of providing the insulator layer comprises thermally growing an oxide layer.

18. The method of claim 2 wherein the step of providing the insulator layer comprises oxide deposition.

19. The method of claim 2 including the further step of forming of additional circuit structure layers above the upper capacitor plate.

20. The method of claim 19 where the additional circuit structure is formed by the steps of:

providing an upper insulator layer on the exposed upper surface of the thinned wafer;

providing a thin film resistive layer on the upper insulator layer to thereby form a thin film resistor overlying the capacitor.

21. A method of forming a capacitor in a bonded wafer comprising the steps of:

a) bonding a device wafer to a handle wafer with a layer of insulation therebetween;

b) selectively forming one or more device islands in the device wafer;

c) selectively dividing the area of the device wafer not used in the formation of device islands into one or more device wafer areas;

d) contacting at least one of the device wafer areas and the handle wafer whereby the device wafer area forms a first capacitor plate and the handle wafer forms a second capacitor plate separated from the first capacitor plate by the insulation layer.

22. A method of forming a capacitor in a bonded wafer comprising the steps of:

a) bonding a device wafer to a handle wafer with a layer of insulation therebetween;

b) selectively forming one or more device islands in the device wafer;

c) selectively dividing the layer of the device wafer not used in the formation of device islands into one or more device wafer areas;

d) contacting at least one of the device wafer areas and the handle wafer whereby the device wafer area forms a first capacitor plate and the handle wafer forms a second capacitor plate separated from the first capacitor plate by the insulation area; and e) forming an isolation trench adjacent an outer edge of the die to protect the outer edge of the die containing the capacitor from damage during the removal of the die from a wafer.

23. The method of claim 21 including the further step of:
   e) forming at least one buried layer in a portion of said device wafer.

24. A method of forming a capacitor in a bonded wafer comprising the steps of:
   a) bonding a device wafer to a handle wafer with a layer of insulation therebetween;
   b) selectively forming one or more device islands in the device wafer;
   c) selectively dividing the layer of the device wafer not used in the formation of device islands into one or more device wafer areas;
   d) contacting at least one of the device wafer areas and the handle wafer whereby the device wafer area forms a first capacitor plate and the handle wafer forms a second capacitor plate separated from the first capacitor plate by the insulation area; and
   e) forming of additional circuit structure layers above at least one of the device wafer areas.

25. A method of forming a capacitor in a bonded wafer comprising the steps of:
   a) forming a device wafer on a handle wafer with a layer of insulation therebetween, the device wafer being formed by the SIMOX process;
   b) selectively forming one or more device islands in the device wafer;
   c) selectively dividing the layer of the device wafer not used in the formation of device islands into one or more device wafer areas;
   d) contacting at least one of the device wafer areas and the handle wafer whereby the device wafer area forms a first capacitor plate and the handle wafer forms a second capacitor plate separated from the first capacitor plate by the insulation area.

26. A method of forming a capacitor in a bonded wafer comprising the steps of:
   a) forming a device wafer on a handle wafer with a layer of insulation therebetween, the device wafer being formed by the ZMR process;
   b) selectively forming one or more device islands in the device wafer;
   c) selectively dividing the layer of the device wafer not used in the formation of device islands into one or more device wafer areas;
   d) contacting at least one of the device wafer areas and the handle wafer whereby the device wafer area forms a first capacitor plate and the handle wafer forms a second capacitor plate separated from the first capacitor plate by the insulation area.

27. A method of forming a capacitor in an IC comprising the steps of:
   a) providing a device wafer and a handle wafer separated by a layer of insulation;
   b) selectively forming one or more device islands in the device wafer;
   c) selectively dividing the area of the device wafer not used in the formation of device islands into one or more device wafer areas;
   d) contacting at least one of the device wafer areas and the handle wafer whereby the contacted device wafer area forms a first capacitor plate and the contacted handle wafer forms a second capacitor plate.

28. The method of claim 27 including the further step of:
   e) forming an isolation trench adjacent an outer edge of a die to protect the outer edge of the capacitor from damage during the removal of the die from a wafer.

29. The method of claim 27 including the further step of:
   e) forming at least one buried layer in a portion of said device wafer.

30. The method of claim 27 including the further step of forming additional circuit structure layers above at least one of the device wafer areas.

31. The method of claim 27 where the additional circuit structure is formed by the steps of:
   e) selectively providing an upper insulator layer on the exposed upper surface of the device wafer;
   f) providing a thin film resistive layer above the upper insulator layer to thereby form a thin film resistor overlying the capacitor.

32. A method of forming a capacitor in an IC comprising the steps of:
   a) providing a device wafer and a handle wafer separated by a layer of insulation, the device wafer being formed by the SIMOX process;
   b) selectively forming one or more device islands in the device wafer;
   c) selectively dividing the area of the device wafer not used in the formation of device islands into one or more device wafer areas;
   d) contacting at least one of the device wafer areas and the handle wafer whereby the contacted device wafer area forms a first capacitor plate and the contacted handle wafer forms a second capacitor plate.

33. A method of forming a capacitor in an IC comprising the steps of:
   a) providing a device wafer and a handle wafer separated by a layer of insulation, the device wafer being formed by the ZMR process;
   b) selectively forming one or more device islands in the device wafer;
   c) selectively dividing the area of the device wafer not used in the formation of device islands into one or more device wafer areas;
   d) contacting at least one of the device wafer areas and the handle wafer whereby the contacted device wafer area forms a first capacitor plate and the contacted handle wafer forms a second capacitor plate.

34. A method of forming a capacitor in a bonded wafer with the process steps used in forming an integrated circuit in the bonded wafer, said method comprising the steps of:
   a) providing a device wafer and a handle wafer each comprising semiconductor material;
   b) providing an insulator layer at a surface of one of the wafers;
   c) bonding the device wafer and handle wafer together with the insulator layer therebetween to form a bonded wafer with the device wafer and handle wafer insulated from each other;
   d) selectively thinning the device wafer to a thickness of between about 1 and 30 microns;
   e) selectively forming one or more insulation channels in the device wafer to thereby form (i) at least one device island, and (ii) a portion of the device wafer external to the device island, wherein the portion of the device wafer external to the device island forms an upper capacitor plate, the handle wafer forms a lower capacitor plate, and the insulator layer forms a dielectric between the two plates of the capacitor;

f) providing an upper insulator layer on the device wafer on a exposed upper surface, wherein the upper insulator layer includes an aperture communicating with the upper capacitor plate;

g) providing an electrically conductive contact on the upper insulator layer extending through the aperture to the upper capacitor plate; and h) providing an electrically conductive contact connected to the lower capacitor plate.

35. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers;

b) providing an insulator layer at a surface of one of the wafers;

c) bonding the wafers together with the insulator layer therebetween to form a bonded wafer;

d) thinning one of the wafers;

e) isolating a portion of the thinned wafer to form a device island therein whereby a portion of the thinned wafer external of the device island forms an upper capacitor plate, the other wafer forms a lower capacitor plate, and the insulator layer forms a capacitor dielectric between the two capacitor plates, the island and the upper capacitor plate being thereby formed out of the same material.

36. The method of claim 35 wherein the step of isolating a portion of the thinned wafer to form a device island comprises the steps of:

(i) etching a channel into the thinned wafer from an exposed surface to the insulator layer; and (ii) lining the channel with an insulating material.

37. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers;

b) providing an insulator layer at a surface of one of the wafers;

c) bonding the wafers together with the insulator layer therebetween to form a bonded wafer;

d) thinning one of the wafers;

e) forming a buried layer in a portion of the thinned wafer external to the device island to be formed; and f) isolating a portion of the thinned wafer to form a device island therein whereby a portion of the thinned wafer external of the device island forms an upper capacitor plate, the unthinned wafer forms a lower capacitor plate, and the insulator layer forms a capacitor dielectric between the two capacitor plates.

38. A method of forming a capacitor in a bonded wafer, the steps of which may be carried out without removing the bonded wafer from an environment in which integrated circuits are formed in the bonded wafer, said method comprising the steps of:

a) providing two wafers of semiconductor material with sufficient thickness to permit the handling thereof without unreasonable likelihood of damaging the wafers;

b) providing an insulator layer at a surface of one of the wafers;

c) bonding the wafers together with the insulator layer therebetween to form a bonded wafer;

d) thinning one of the wafers;

e) isolating a portion of the thinned wafer to form a device island therein whereby a portion of the thinned wafer external of the device island forms an upper capacitor plate, the unthinned wafer forms a lower capacitor plate, and the insulator layer forms a capacitor dielectric between the two capacitor plates; and f) forming of additional circuit structure layers above the upper capacitor plate.

39. The method of claim 38 where the additional circuit structure is formed by the steps of:

providing an upper insulator layer on the exposed upper surface of the thinned wafer;

providing a thin film resistive layer on the upper insulator layer to thereby form a thin film resistor overlying the capacitor.

40. A method of forming a capacitor in a bonded wafer comprising the steps of:

a) forming a homogeneous device wafer to a handle wafer with a layer of insulation therebetween;

b) selectively forming one or more device islands in the device wafer;

c) selectively dividing the area of the device wafer not used in the formation of device islands into one or more device wafer areas;

d) contacting at least one of the device wafer areas and the handle wafer whereby the device wafer area forms a first capacitor plate and the handle wafer forms a second capacitor plate separated from the first capacitor plate by the insulation area.

41. A method of forming a capacitor in a bonded wafer comprising the steps of:

a) forming a device wafer to a handle wafer with a layer of insulation therebetween;

b) selectively forming one or more device islands in the device wafer;

c) selectively dividing the area of the device wafer not used in the formation of device islands into one or more device wafer areas; and d) contacting at least one of the device wafer areas and the handle wafer whereby the device wafer area forms a first capacitor plate and the handle wafer forms a second capacitor plate separated from the first capacitor plate by the insulation area, at least one of the device islands and the first capacitor plate being formed out of the same material.

42. A method of forming a capacitor in an IC comprising the steps of:

a) providing a handle wafer and a homogeneous device wafer separated by a layer of insulation;

b) selectively forming one or more device islands in the homogeneous device wafer;

c) selectively dividing the area of the homogeneous device wafer not used in the formation of device islands into one or more device wafer areas;

d) contacting at least one of the homogeneous device wafer areas and the handle wafer whereby the contacted homogeneous device wafer area forms a first capacitor plate and the contacted handle wafer forms a second capacitor plate separated from the first capacitor plate by the layer of insulation.

43. A method of forming a capacitor in an IC comprising the steps of:

a) providing a device wafer and a handle wafer separated by a layer of insulation;

b) selectively forming one or more device islands in the device wafer;

c) selectively dividing the area of the device wafer not used in the formation of device islands into one or more device wafer areas;

d) contacting at least one of the device wafer areas and the handle wafer whereby the contacted device wafer area forms a first capacitor plate and the contacted handle wafer forms a second capacitor plate, the one or more device islands and the upper capacitor plate being thereby formed out of the same material.

* * * * *